United States Patent [19]

Seki

[11] 4,015,215
[45] Mar. 29, 1977

[54] PUSH-PULL POWER AMPLIFIER CIRCUIT
[75] Inventor: Kunio Seki, Tokyo, Japan
[73] Assignee: Hitachi, Ltd., Japan
[22] Filed: Aug. 28, 1975
[21] Appl. No.: 608,735
[30] Foreign Application Priority Data
Aug. 28, 1974 Japan .............................. 49-97908
[52] U.S. Cl. ................................... 330/15; 330/13; 330/17; 330/22; 330/149
[51] Int. Cl.² ........................................ H03F 3/26
[58] Field of Search .................. 330/13, 15, 17, 22, 330/149

[56] References Cited
UNITED STATES PATENTS
3,904,972  9/1975  Seki et al. ......................... 330/17 X Primary Examiner—James B. Mullins
Attorney, Agent, or Firm—Craig & Antonelli

[57] ABSTRACT

A push-pull power amplifier circuit has a supply voltage ripple removing filter connected to a first amplifier stage which includes a first load circuit. A push-pull output stage is composed of at least an output driver and amplifier portion connected to the supply voltage through a second load circuit and an output amplifier portion driven by the output signal of the output driver and amplifier portion as produced in the second load circuit. The second load circuit is provided as a variable impedance which is controlled by a voltage derived from the supply voltage ripple removing filter to prevent operation of said output amplifier portion prior to operation of said first amplifier stage subsequent to switching on of the power supply so as to avoid a "pop" noise being generated in the output of the amplifier.

22 Claims, 3 Drawing Figures

PUSH-PULL POWER AMPLIFIER CIRCUIT

FIELD OF THE INVENTION

This invention relates to a push-pull power amplifier circuit. More particularly, it is directed to a push-pull power amplifier circuit of the single power supply system.

DESCRIPTION OF THE PRIOR ART

In a push-pull output circuit of the single power supply system employing transistors, a D.C. blocking capacitor is interposed between the output side of the circuit and the speaker load so as to prevent a D.C. current from flowing through the voice coil of the speaker. For this reason, the instant the power supply is turned "on," an impulsive transient current flows from the power supply via the D.C. blocking capacitor to the load. In consequence, an unpleasant impulsive sound (hereinbelow termed the pop sound) is given forth from the speaker. Moreover, it is feared in some cases that the voice coil of the speaker will be damaged by the transient current. As regards a method for avoiding these drawbacks, Japanese Patent Application Publication No. 8001/1971 discloses a circuit arrangement in which a delay time constant circuit is separately inserted between the base of a preceding-stage amplifying transistor and a power supply terminal to thus make the rise of the output transistor gentle and slow. In case of fabricating the circuit arrangement in the form of a semiconductor integrated circuit (hereinafter termed the "IC"), however, the IC disadvantageously has an increased number of pins because the separate delay circuit is connected externally of the IC.

Figure 2:
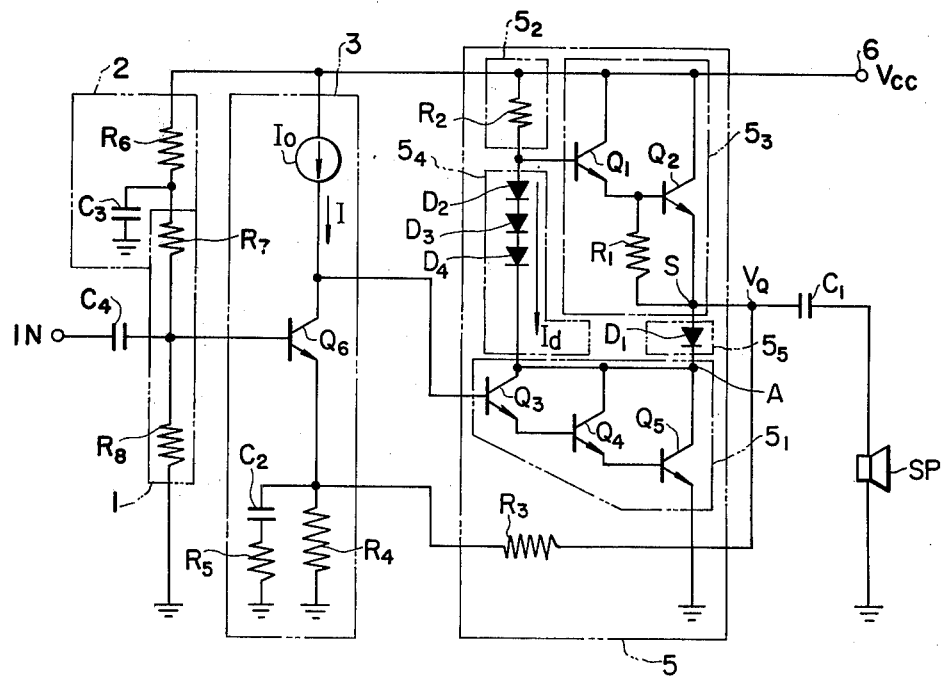
FIG. 2 is a circuit diagram which shows an example of a prior-art push-pull power amplifier circuit.

As a push-pull power amplifier circuit which eliminates the pop sound without increasing the number of pins, one as shown in FIG. 2 is known (sold under the trade name 'HA 1309' by Hitachi Ltd., assignee of the present case).

The push-pull power amplifier circuit shown in the figure includes a first amplifier stage 3 and a succeeding push-pull output stage 5. The first amplifier stage 3 comprises a first-stage amplifying transistor $Q_6$ having a base, a collector and an emitter, first load means $I_o$ of the constant current load type, and emitter grounding impedances $R_4$, $C_2$ and $R_5$, and it amplifies an input signal applied through an input coupling capacitor $C_4$. The push-pull output stage 5 further amplifies an output signal of the first amplifier stage 3, and delivers a push-pull output signal to an output terminal S.

The push-pull output amplifier stage 5 is generally called the toten pole type push-pull output circuit, the details of which are introduced in 'A High-Performance 3-Watt Monolithic Class-B Power Amplifier,' pp. 14 – 15 of the publication '1967 International Solid-State Circuits Conference' published February 15, 1967.

The toten pole type push-pull output stage 5 is composed of an output driver and amplifier portion $5_1$ which comprises transistors $Q_3$, $Q_4$ and $Q_5$ in three-stage Darlington connection; a second load $5_2$ which comprises a resistance $R_2$; an output amplifier portion $5_3$ which comprises transistors $Q_1$ and $Q_2$ in two-stage Darlington connection, these transistors turning towards conduction with decrease in a drive signal current $I_d$ flowing through the output driver and amplifier portion $5_1$; a first diode coupling circuit $5_4$ which comprises diodes $D_2$, $D_3$ and $D_4$; and a second diode coupling circuit $5_5$ which comprises a diode $D_1$. The respective collectors of the Darlington-connected transistors $Q_3$, $Q_4$ and $Q_5$ in the output driver and amplifier portion $5_1$ are connected through the second diode coupling circuit $5_5$ of the diode $D_1$ to the output terminal S. The output driver and amplifier portion $5_1$ is connected in series with the second load means $5_2$ through the first diode coupling circuit $5_4$ consisting of the diodes $D_2$, $D_3$ and $D_4$, and it is thus connected between a part of the ground potential and a power supply terminal 6 to which a supply voltage $V_{cc}$ having a positive suitable value is fed. The output amplifier portion $5_3$ is connected between the power supply terminal 6 and the output terminal S, and the base of the transistor $Q_1$ in the output amplifier portion $5_3$ is connected to the second load means $5_2$, so that the output amplifier portion $5_3$ is driven by an output signal of the output driver and amplifier portion $5_1$.

The push-pull operation of the totem pole type push-pull output stage 5 will be explained more in detail. When a positive half-cycle output signal current from the first amplifier stage 3 is applied to the base of the transistor $Q_3$ of the output driver and amplifier portion $5_1$, the transistors $Q_3$, $Q_4$ and $Q_5$ of the output driver and amplifier portion $5_1$ turns towards the conductive state. Due to the conduction of the output driver and amplifier portion $5_1$, the drive signal current $I_d$ to flow through the output driver and amplifier portion $5_1$ increases, and hence, a voltage drop across the second load means $5_2$ becomes large. In consequence, the base potential of the transistor $Q_1$ lowers to turn the output amplifier portion $5_3$ towards the nonconductive state, so that the potential of the output terminal S lowers.

In contrast, when a negative half-cycle output signal current from the first amplifier stage 3 is applied to the base of the transistor $Q_3$, the transistors $Q_3$, $Q_4$ and $Q_5$ of the output driver and amplifier portion $5_1$ turn towards the nonconductive state. Since the drive signal current $I_d$ decreases, conversely to the foregoing the base potential of the transistor $Q_1$ rises, the output amplifier portion $5_3$ turns towards the conductive state and the potential of the output terminal S rises. In this way, the so-called push-pull operation is performed.

A supply voltage ripple removing filter 2 which consists of a resistance $R_6$ and a capacitor $C_3$, and first-stage bias means 1 which consists of a first voltage dividing resistance $R_7$ and a second voltage dividing resistance $R_8$ are connected in series. Thus, they are connected between the power supply terminal 6 and parts of the ground potential. To the juncture between the first voltage dividing resistance $R_7$ and the second voltage dividing resistance $R_8$, the input coupling capacitor $C_4$ is connected so as to impress an input signal IN on the base of the first-stage amplifying transistor $Q_6$.

By connecting the output terminal S and the emitter of the first-stage amplifying transistor $Q_6$ through a feedback resistance $R_3$, the whole push-pull power amplifier circuit is subjected to the D.C. - A.C. negative feedback. As a result, not only the D.C. potential of the output terminal S is stabilized, but also the distortion factor characteristic and the frequency characteristic of the push-pull power amplifier circuit are rendered good.

The circuit shown in FIG. 2 skillfully makes use of the time constant of the supply voltage ripple removing filter 2 ($C_3$, $R_6$). More specifically, the time constant of the supply voltage ripple removing filter ($C_3$, $R_6$) is large. Immediately after the closure of the power supply, therefore, the voltage produced in the ripple removing filter 2 is small. In consequence, a voltage produced at the juncture between the first voltage dividing resistance $R_7$ and the second voltage dividing resistance $R_8$ is small. The first-stage amplifying transistor $Q_6$ is accordingly kept "off." On the other hand, the constant current source $I_o$ as the load of the first-stage amplifying transistor $Q_6$ operates at once. It starts permitting a current I to flow, and biases the bases of the transistors $Q_3 - Q_5$ of the output driver and amplifier portion $5_1$. The transistors $Q_3 - Q_5$ of the output driver and amplifier portion $5_1$ fall eventually into the conductive state. As a result, a current of comparatively large magnitude flows through the resistance $R_2$ and the diodes $D_2 - D_4$. This current is absorbed into the transistors $Q_3 - Q_5$. On account of a voltage drop across the resistance $R_2$ as attributed to this current, the base potential of the transistor $Q_1$ in the output amplifier portion $5_3$ is low. The transistors $Q_1$ and $Q_2$ in the two-stage Darlington connection are maintained substantially in the nonconductive state, and only slight currents flow therethrough.

Accordingly, directly after the closure of the power supply, the output amplifier portion $5_3$ is kept substantially in the nonconductive state, the output driver and amplifier portion $5_1$ is in the conductive state, and the potential of the output terminal S is held at a comparatively low value. Therefore, any large impulse current does not flow into the D.C. blocking capacitor $C_1$ and the speaker SP.

In the next place, the base voltage of the first-stage amplifying transistor $Q_6$ rises gradually owing to a voltage rise of the supply voltage ripple removing filter 2. Then, the transistor $Q_6$ is rendered conductive and begins to absorb the current from the constant current load $I_o$. For this reason, the current flowing through the transistors $Q_3 - Q_5$ of the output driver and amplifier portion $5_1$ decreases, and the transistors $Q_3 - Q_5$ gradually become inferior in the degree of conduction. In consequence, the transistors $Q_1$ and $Q_2$ of the output amplifier portion $5_3$ have the base voltages raised and gradually fall into the conductive state. Thus, the potential $V_Q$ of the output terminal S rises gradually and is not built up abruptly. Therefore, no impulse current flows and the pop sound is preventable.

In this way, the pop sound regarded as a problem at first was prevented. It was revealed, however, that a small pop sound was still generated.

This problem was studied, and has proved to be caused by the following fact.

At the closure of the power supply, the constant current load $I_o$ operates to supply the currents to the bases of the transistors $Q_3 - Q_5$ of the output driver and amplifier portion $5_1$ and to render these transistors conductive. In a period till the conduction of the transistors $Q_3 - Q_5$ has effect, the base currents are supplied from the resistance $R_2$ to the transistors $Q_1$ and $Q_2$. Therefore, the transistors $Q_1$ and $Q_2$ of the output amplifier portion $5_3$ are also going to become conductive. In consequence, the transistors of both the output driver and amplifier portion $5_1$ and the output amplifier portion $5_3$ are in the conductive state for a moment. A voltage $V_Q = V_{BEQ_3} + V_{BEQ_4} + V_{CE(sat)Q_5} + V_{FD_1} \approx 2.4$ (volts) is produced at the output terminal S. Since this voltage causes a current to flow through the capacitor $C_1$ and the speaker SP, the small pop sound is given forth.

SUMMARY OF THE INVENTION

This invention has been made in order to solve the problem stated above, and has for its object to prevent such small pop sound of the push-pull power amplifier circuit based on the single power supply system.

In accordance with one aspect of performance of this invention, there is provided a push-pull power amplifier circuit comprising a supply voltage ripple removing filter; a first-stage bias circuit; a first amplifier stage which is composed at least of a firststage amplifying transistor having a base, a collector and an emitter, and a first load; a push-pull output stage which is composed at least of an output driver and amplifier portion, a second load, and an output amplifier portion tending towards conduction with decrease in a drive signal current of the output driver and amplifier portion; a supply voltage feed terminal; and an output terminal; the supply voltage ripple filter and the first-stage bias circuit being connected in series between the supply voltage feed terminal and a ground potential; the input electrode of the firststage amplifying transistor being connected to the firststage bias circuit; first and second terminals of the first load being respectively connected to the supply voltage feed terminal and the collector of the first-stage amplifying transistor; the output driver and amplifier portion being connected between the output terminal and the ground potential; the output driver and amplifier portion and the second load being conneced in series between the supply voltage feed terminal and the ground potential; the output amplifier portion being connected between the supply voltage feed terminal and the output terminal; the output driver and amplifier portion being driven by an output signal of the first amplifier stage as produced in the first load; the output amplifier portion being driven by an output signal of the output driver and amplifier portion as produced in the second load; whereby the output driver and amplifier portion and the output amplifier portion perform a push-pull operation and deliver push-pull output signals to the output terminals; characterized in that the second load is a variable impedance element which includes a control terminal and whose impedance is controlled by a control signal applied to the control terminal, the control terminal of the second load being controlled in dependence at least on a voltage generated in the supply voltage ripple removing filter.

PREFERRED EMBODIMENTS OF THE INVENTION

Hereunder this invention will be more specifically explained with respect to various embodiments with reference to the drawing.

Figure 1:
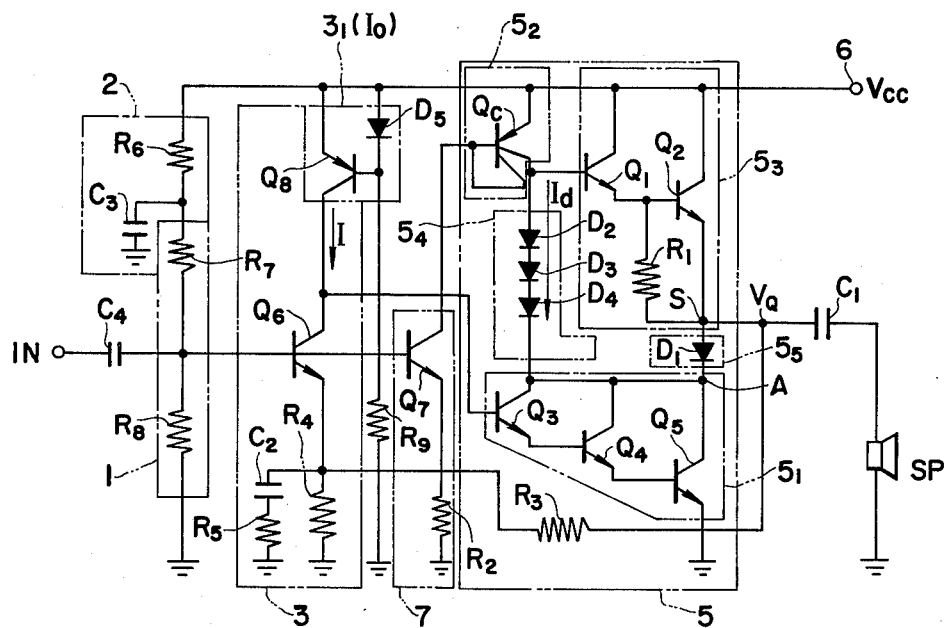
FIG. 1 is a circuit diagram which shows an embodiment of a push-pull power amplifier circuit according to this invention.

FIG. 1 is a circuit diagram showing an embodiment of this invention.

As illustrated in the figure, a push-pull power amplifier circuit of the embodiment has a supply voltage ripple removing filter 2 which consists of a resistance $R_6$ and a capacitor $C_3$; first-stage bias means 1 which is constructed of a series connection consisting of a first voltage dividing resistance $R_7$ and a second voltage dividing resistance $R_8$; a first amplifier stage 3 which is constructed of a first-stage amplifying transistor $Q_6$ having a base, a collector and an emitter, first load means $3_1(I_o)$ including a constant current load transistor $Q_8$, and emitter grounding impedances of resistances $R_4$ and $R_5$ and a capacitor $C_2$; a totem pole type push-pull output stage 5; a control circuit 7 which consists of a controlling transistor $Q_7$ and a resistance $R_2$; a supply voltage terminal 6; and an output terminal S. The totem pole type push-pull output stage 5 is constructed of an output driver and amplifier portion $5_1$ which consists of transistors $Q_3$, $Q_4$ and $Q_5$ in three-stage Darlington connection; a second load means $5_2$ which is composed of a multicollector transistor $Q_c$; an output amplifier portion $5_3$ which includes transistors $Q_1$ and $Q_2$ in two-stage Darlington connection, these transistors turning towards conduction with decrease in a drive signal current $I_d$ to flow into the output driver and amplifier portion $5_1$; a first diode coupling circuit $5_4$ which consists of diodes $D_2$, $D_3$ and $D_4$; and a second diode coupling circuit $5_5$ which is composed of a diode $D_1$.

The supply voltage ripple removing filter 2 and the first-stage bias means 1 are connected in series between the supply voltage terminal 6 and the ground potential. The base of the first-stage amplifying transistor $Q_6$ is connected to the juncture between the first voltage dividing resistance $R_7$ and the second voltage dividing resistance $R_8$ in the first-stage bias means 1, and it responds to an input signal IN applied through an input coupling capacitor $C_4$. The constant-current first load means $3_1(I_o)$ in the first amplifier stage 3 has the constant current load transistor $Q_8$, the emitter of which is connected to the power supply terminal 6 and the collector of which is connected to the collector of the first-stage amplifying transistor $Q_6$ and also to the base of the transistor $Q_3$ of the totem pole type push-pull output stage 5. Further, a diode $D_5$ is connected in parallel between the emitter and base of the constant current load transistor $Q_8$. Still further, a resistance $R_9$ is connected between the diode $D_5$ and the ground potential. Accordingly, a constant current which is determined by a supply voltage $V_{cc}$ flows through the diode $D_5$ and the resistance $R_9$. The current causes a voltage drop across the diode $D_5$. The voltage drop across the diode $D_5$ biases the base - emitter circuit of the constant current load transistor $Q_8$, and a constant current flows out from the collector thereof.

In consequence, a signal current corresponding to a component of the difference between a collector signal current which flows through the collector of the first-stage amplifying transistor $Q_6$ in response to the input signal IN applied through the input coupling capacitor $C_4$ and the constant current from the collector of the constant current load transistor $Q_8$ is supplied to the base of the transistor $Q_3$ of the totem pole type push-pull output stage 5.

On the other hand, the respective collectors of the Darlington-connected transistors $Q_3$, $Q_4$ and $Q_5$ in the output driver and amplifier portion $5_1$ are connected to the output terminal S through the second diode coupling circuit $5_5$ made up of the diode $D_1$, and are also connected to the first collector of the multicollector transistor $Q_c$ in the second load means $5_2$ and the base of the transistor $Q_1$ in the output amplifier portion $5_3$ through the first diode coupling circuit $5_4$ made up of the diodes $D_2$, $D_3$ and $D_4$. The emitter of the multicollector transistor $Q_c$ is connected to the power supply terminal 6 and the base is connected to the second collector of the same transistor $Q_c$, so that the connection between the base and the second collector provides a diode equivalently connected between the power supply terminal and the base. Both the base and the second collector of the multicollector transistor $Q_c$ are connected to the collector of the controlling transistor $Q_7$ in the control circuit 7. Further, the output amplifier portion $5_3$ made up of the Darlington-connected transistors $Q_1$ and $Q_2$ is connected between the supply voltage terminal 6 and the output terminal S. A feedback signal from the output terminal S is impressed on the emitter of the first-stage amplifying transistor $Q_6$ through a feedback resistance $R_3$. Thus, the D.C. - A.C. negative feedback is executed. The output point S of the totem pole type push-pull output stage is connected through a capacitor $C_1$ to a speaker SP which is a load.

In such embodiment, where the difference component signal current which is applied from the first amplifier stage 3 to the base of the transistor $Q_3$ of the output driver and amplifier portion $5_1$ in the totem pole type push-pull output stage 5 in response to the input signal IN increases, all the transistors $Q_3$, $Q_4$ and $Q_5$ of the output driver and amplifier portion $5_1$ rise in the degree of conduction. At this time, the collector signal current of the controlling transistor $Q_7$ decreases, and also the signal current which flows through the diode equivalently connected between the supply voltage terminal 6 and the base of the multicollector transistor $Q_c$ decreases. As the result, the signal current which flows out from the first collector of the multicollector transistor $Q_c$ decreases, and the output amplifier stage $5_3$ lowers in the degree of conduction.

Conversely, where the difference component signal current which is applied to the base of the transistor $Q_3$ of the output driver and amplifier portion $5_1$ decreases, all the transistors $Q_3$, $Q_4$ and $Q_5$ of the output driver and amplifier portion $5_1$ lower in the degree of conduction. In contrast, the collector signal current of the controlling transistor $Q_7$ increases, the signal current flowing out from the first collector of the multicollector transistor $Q_c$ increases, and the degree of conduction of the output amplifier stage $5_3$ increases.

In this manner, the totem pole type push-pull output stage 5 carries out the so-called push-pull operation, while the second load means $5_2$ composed of the multicollector transistor $Q_c$ carries out the active operation responsive to the input signal IN.

In accordance with this invention as described above in conjunction with the embodiment, the object can be accomplished by the operation to be stated below.

The time constant of the components $C_3$ and $R_6$ in the supply voltage ripple eliminating filter 2 is large. At the closure of the power supply, therefore, the first-stage amplifying transistor $Q_6$ and the controlling transistor $Q_7$ have a base potential close to the ground potential, and they are nonconductive. On the other hand, the first load constant-current source $3_1(I_o)$ of the first-stage amplifying transistor $Q_6$ immediately starts causing the current to flow. The constant current source $3_1(I_o)$ supplies base currents to the transistors $Q_3$ - $Q_5$ of the output driver and amplifier portion $5_1$, and intends to render the transistors $Q_3$ - $Q_5$ conductive. Since, at this time, the controlling transistor $Q_7$ is nonconductive, the multicollector transistor $Q_c$ of the second load means $5_2$ is nonconductive and supplies no base current to the transistors $Q_1$ and $Q_2$ of the output amplifier portion $5_3$, so that the transistors $Q_1$ and $Q_2$ are in the nonconductive state. Accordingly, the diode $D_1$ of the second diode coupling circuit $5_5$ is reverse-biased, and no voltage is generated at the output terminal S. Therefore, no impulse current flows to the speaker SP.

Subsequently, the voltage in the supply voltage ripple eliminating filter 2 rises. The first-stage amplifying transistor $Q_6$ consequently becomes conductive gradually, so that it begins to absorb the current from the first load constant-current source $3_1(I_o)$ gradually. Therefore, the base voltages of the transistors $Q_3 - Q_5$ of the output driver and amplifier portion $5_1$ lower, and the degrees of conduction become inferior gradually. On the other hand, the controlling transistor $Q_7$ which is driven simultaneously with the first-stage amplifying transistor $Q_6$ becomes conductive gradually, so that the multicollector transistor $Q_c$ becomes conductive gradually and that the transistors $Q_1$ and $Q_2$ of the output amplifier portion $5_3$ becomes conductive gradually. As the result, the voltage $V_Q$ of the output point S rises gradually.

For the reason set forth above, the pop sound can be prevented substantially perfectly.

In this invention, no time constant circuit is provided especially for the prevention of the pop sound, but the power supply ripple removing filter or the like time constant circuit is utilized. Therefore, the push-pull power amplifier circuit according to this invention can be built into the IC without the increase of separate external mounting pins and can achieve a reduction of cost and the enhancement of reliability.

Although this invention has been explained above in conjunction with one embodiment thereof, it can adopt various aspects of performance without being restricted to the embodiment described.

Figure 3:
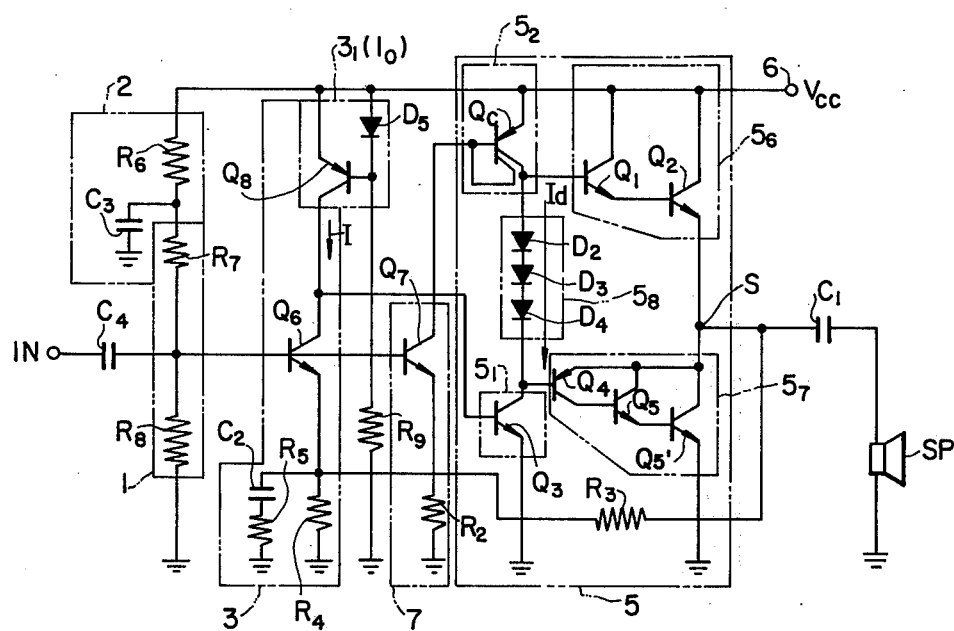
FIG. 3 is a circuit diagram which shows another embodiment of this invention.

FIG. 3 shows a push-pull power amplifier circuit according to another embodiment of this invention. The difference of this embodiment from the foregoing embodiment in FIG. 1 lies in the circuit form of the push-pull output stage 5.

The push-pull output stage 5 employed in this embodiment is generally called the quasi-complementary type push-pull output circuit. It is constructed of an output driver and amplifier portion $5_1$ which is made up of an output driving transistor $Q_3$, second load means $5_2$ which is made up of a multicollector transistor $Q_c$, a first output amplifier portion $5_6$ which turns towards conduction with decrease in a drive signal current $I_d$ flowing through the output driver and amplifier portion $5_1$, a second output amplifier portion $5_7$ which conducts with increase in the drive signal current $I_d$, and a diode coupling circuit $5_8$ which consists of diodes $D_2$, $D_3$ and $D_4$.

The first output amplifier portion $5_6$ consists of Darlington-connected transistors $Q_1$ and $Q_2$, it is connected between a supply voltage terminal 6 and an output terminal S, and it is driven by the drive signal current $I_d$ flowing through the output driving transistor $Q_3$. The second output amplifier portion $5_7$ consists of transistors $Q_4$, $Q_5$ and $Q_5'$ in complementary connection, it is connected between the output terminal S and the ground potential, and it is also driven by the drive signal current $I_d$.

Also in this embodiment, where the difference component signal current from the first amplifier stage 3 as applied to the base of the transistor $Q_3$ of the output driver and amplifier portion $5_1$ in the quasi-complementary type push-pull output stage 5 increases in response to the input signal IN, the drive signal current $I_d$ flowing through the output driver and amplifier portion $5_1$ increases, and the base current flowing out from the base of the transistor $Q_4$ of the second output amplifier portion $5_7$ increases, so that the degree of conduction of the second output amplifier portion $5_7$ rises. At this time, the collector signal current of the controlling transistor $Q_7$ decreases. As in the embodiment shown in FIG. 1, the signal current flowing out from the first collector of the multicollector transistor $Q_c$ decreases, and the base current flowing into the base of the transistor $Q_1$ of the first output amplifier portion $5_6$ decreases, so that the degree of conduction of the first output amplifier portion $5_6$ lowers.

Conversely, where the difference component signal current from the first amplifier stage 3 as applied to the base of the transistor $Q_3$ of the output driver and amplifier portion $5_1$ decreases, the drive signal current $I_d$ flowing through the output driver and amplifier portion $5_1$ decreases. Simultaneously therewith, the collector signal current of the controlling transistor $Q_7$ increases, so that the signal current flowing out from the first collector of the multicollector transistor $Q_c$ increases. Accordingly, the base current flowing into the base of the transistor $Q_1$ of the first output amplifier portion $5_6$ increases, so that the degree of conduction of the first output amplifier portion $5_6$ increases. In contrast, the base current flowing out from the base of the transistor $Q_4$ of the second output amplifier portion $5_7$ decreases, so that the degree of conduction of the second output amplifier portion lowers.

In this manner, the quasi-complementary type push-pull output stage 5 carries out the so-called push-pull operation, while the second load means composed of the multicollector transistor $Q_c$ carries out the active operation responsive to the input signal IN.

Such embodiment can prevent the pop sound substantially perfectly for essentially the same reason as in the previous embodiment of FIG. 1.

The concrete embodiments of this invention have been explained above. As a modified embodiment, the multicollector transistor $Q_c$ of the second load means $5_2$ can be replaced with two transistors whose emitters and bases are respectively connected in common. Further, a variable impedance of, for example, a field-effect transistor can be utilized. Regarding the circuit form of the push-pull output stage 5, a pure complementary type push-pull circuit may be adopted besides the totem pole type and quasi-complementary type ones.

I claim:

1. A push-pull power amplifier circuit comprising at least supply voltage ripple removing means; first-stage bias means; a first amplifier stage which is composed at least of a firststage amplifying element having an input electrode, an output electrode and a grounding electrode, and first load means, a pushpull output stage which is composed at least of an output driver and amplifier portion, second load means, and an output amplifier portion tending towards conduction with decrease in a drive signal current of said output driver and amplifier portion; a supply voltage feed terminal; and an output terminal; said supply voltage ripple removing means and said first-stage bias means being connected in series between said supply voltage feed terminal and ground potential; said input electrode of said first-stage amplifying element being connected to said first-stage bias means; first and second terminals of said first load means being respectively connected to said supply voltage feed terminal and said output electrode of said first-stage amplifying element; said output driver and amplifier portion being connected between said output terminal and ground potential; said output driver and amplifier portion and said second load means being connected in series between said supply voltage feed terminal and ground potential; said output amplifier portion being connected between said supply voltage feed terminal and said output terminal; said output driver and amplifier portion being driven by an output signal of said first amplifier stage as produced in said first load means; said output amplifier portion being connected to said second load means and being driven by an output signal of said output driver and amplifier portion as produced in said second load means; whereby said output driver and amplifier portion and said output amplifier portion perform a push-pull operation and deliver push-pull output signals to said output terminal; said second load means being provided as a variable impedance means responsive to a voltage generated in said supply voltage ripple removing means to provide an impedance prior to operation of said first amplifier stage for preventing operation of said output amplifier portion.

2. The push-pull power amplifier circuit according to claim 1, wherein said grounding electrode of said first-stage amplifying element is connected to ground potential.

3. The push-pull power amplifier circuit according to claim 2, wherein said grounding electrode of said first-stage amplifying element is connected to ground potential through impedance means.

4. The push-pull power amplifier circuit according to claim 1, further including control means comprising a controlling and amplifying element having an input electrode, a grounding electrode and an output electrode; and wherein said second load means comprises a transistor and diode means connected in parallel between the base and the emitter of said transistor, said emitter of said transistor being connected to said supply voltage feed terminal, the collector of said transistor being connected to said output driver and amplifier portion, said base of said transistor being connected to said output electrode of said controlling and amplifying element, said grounding electrode of said controlling and amplifying element being connected to ground potential, said input electrode of said controlling and amplifying element being controlled in dependence at least on said voltage generated in said supply voltage ripple removing means.

5. The push-pull power amplifier circuit according to claim 4, wherein said first-stage bias means comprises first voltage dividing bias means and second voltage dividing bias means connected in series, said input electrode of said first-stage amplifying element and said input electrode of said controlling and amplifying element being both connected to a juncture between said first and second voltage dividing bias means so that they are controlled in dependence on said voltage generated in said supply voltage ripple removing means, while they respond to an input signal of said push-pull power amplifier circuit as applied to said juncture, with the result that said second load means performs an active operation responsive to said input signal.

6. The push-pull power amplifier circuit according to claim 5, wherein said grounding electrode of said first-stage amplifying element is connected to ground potential through impedance means and is connected to said output terminal through feedback impedance means, said output driver and amplifier portion and said second load means are connected in series between said supply voltage feed terminal and said ground potential through first diode coupling means, and said output driver and amplifier portion is connected to said output terminal through second diode coupling means.

7. The push-pull power amplifier circuit according to claim 6, wherein said grounding electrode of said controlling and amplifying element is connected to ground potential through another impedance means.

8. The push-pull power amplifier circuit according to claim 1, further including control means comprising a controlling and amplifying element having an input electrode, a ground electrode and an output electrode; and wherein said second load means comprises a multicollector transistor having at least a first collector, a second collector, a base and an emitter, said second collector and said base of said multicollector transistor being connected to each other, said emitter of said multicollector transistor being connected to said supply voltage feed terminal, said first collector of said multicollector transistor being connected to said output driver and amplifier portion, said base of said multicollector transistor being connected to said output electrode of said controlling and amplifying element, said grounding electrode of said controlling and amplifying element being connected to ground potential, said input electrode of said controlling and amplifying element being controlled in dependence at least on said voltage generated in said supply voltage ripple removing means.

9. The push-pull power amplifier circuit according to claim 8, wherein said first-stage bias means comprises first voltage dividing bias means and second voltage dividing bias means connected in series, said input electrode of said first-stage amplifying element and said input electrode of said controlling and amplifying element being both connected to a juncture between said first and second voltage dividing bias means so that they are controlled in dependence on said voltage generated in said supply voltage ripple removing means, while they respond to an input signal of said push-pull power amplifier circuit as applied to said juncture, with the result that said second load means performs an active operation responsive to said input signal.

10. The push-pull power amplifier circuit according to claim 9, wherein said grounding electrode of said first-stage amplifying element is connected to ground potential through impedance means and is connected to said output terminal through feedback impedance means, said output driver and amplifier portion and said second load means are connected in series between said supply voltage feed terminal and said ground potential through first diode coupling means, and said output driver and amplifier portion is connected to said output terminal through second diode coupling means.

11. The push-pull power amplifier circuit according to claim 10, wherein said grounding electrode of said controlling and amplifying element is connected to ground potential through another impedance means.

12. A push-pull power amplifier circuit comprising at least supply voltage ripple removing means, first-stage bias means; a first amplifier stage which is composed at least of a first-stage amplifying element having an input electrode, an output electrode and a grounding electrode, and first load means; a push-pull output stage which is composed at least of an output driver and amplifier portion, second load means, a first output amplifier portion tending towards conduction with decrease in a drive signal current of said output driver and amplifier portion, and a second output amplifier portion tending towards conduction with increase in said drive signal current; a supply voltage feed terminal; and an output terminal; said supply voltage ripple removing means and said first-stage bias means being connected in series between said supply voltage feed terminal and a ground potential; said input electrode of said firststage amplifying element being connected to said first-stage bias means; first and second terminals of said first load means being respectively connected to said supply voltage feed terminal and said output electrode of said first-stage amplifying element; said output driver and amplifier portion and said second load means being connected in series between said supply voltage feed terminal and said ground potential; said first output amplifier portion being connected between said supply voltage feed terminal and said output terminal; said second output amplifier portion being connected between said output terminal and said ground potential; said first and second output amplifier portions being both driven by an output signal of said driver and amplifier portion, thus to perform a push-pull operation and to deliver push-pull output signals to said output terminal; said second load means being provided as a variable impedance means connected to the input of said output amplifier portion and responsive to a voltage generated in said supply voltage ripple removing means to provide an impedance prior to operation of said first amplifier stage for preventing operation of said output amplifier portion.

13. The push-pull power amplifier circuit according to claim 12, wherein said grounding electrode of said first-stage amplifying element is connected to ground potential.

14. The push-pull power amplifier circuit according to claim 13, wherein said grounding electrode of said first-stage amplifying element is connected to ground potential through impedance means.

15. The push-pull power amplifier circuit according to claim 12, further including control means comprising a controlling and amplifying element having an input electrode, a grounding electrode and an output electrode; and wherein said second load means comprises a transistor and diode means connected in parallel between the base and the emitter of said transistor, said emitter of said transistor being connected to said supply voltage feed terminal, the collector of said transistor being connected to said output driver and amplifier portion, said base of said transistor being connected to said output electrode of said controlling and amplifying element, said grounding electrode of said controlling and amplifying element being connected to ground potential, said input electrode of said controlling and amplifying element being controlled in dependence at least on said voltage generated in said supply voltage ripple removing means.

16. The push-pull power amplifier circuit according to claim 15, wherein said first-stage bias means comprises first voltage dividing bias means and second voltage dividing bias means connected in series, said input electrode of said first-stage amplifying element and said input electrode of said controlling and amplifying element being both connected to a juncture between said first and second voltage dividing bias means so that they are controlled in dependence on said voltage generated in said supply voltage ripple removing means, while they respond to an input signal of said push-pull power amplifier circuit as applied to said juncture, with the result that said second load means performs an active operation responsive to said input signal.

17. The push-pull power amplifier circuit according to claim 16, wherein said grounding electrode of said first-stage amplifying element is connected to ground potential through impedance means and is connected to said output terminal through feedback impedance means, and said output driver and amplifier portion and said second load means are connected in sereis between said supply voltage feed terminal and said ground potential through diode coupling means.

18. The push-pull power amplifier circuit according to claim 17, wherein said grounding electrode of said controlling and amplifying element is connected to ground potential through another impedance means.

19. The push-pull amplifier circuit according to claim 12, further including control means comprising a controlling and amplifying element having an input electrode, a grounding electrode and an output electrode; and wherein said second load means comprises a multicollector transistor having at least a first collector, a second collector, a base and an emitter, said second collector and said base of said multicollector transistor being connected to each other, said emitter of said multicollector transistor being connected to said supply voltage feed terminal, said first collector of said multicollector transistor being connected to said output driver and amplifier portion, said base of said multicollector transistor being connected to said output electrode of said controlling and amplifying element, said grounding electrode of said controlling and amplifying element being connected to ground potential, said input electrode of said controlling and amplifying element being controlled in dependence at least on said voltage generated in said supply voltage ripple removing means.

20. The push-pull power amplifier circuit according to claim 19, wherein said first-stage bias means comprises first voltage dividing bias means and second voltage dividing bias means connected in series, said input electrode of said first-stage amplifying element and said input electrode of said controlling and amplifying element being both connected to a juncture between said first and second voltage dividing bias means so that they are controlled in dependence on said voltage generated in said supply voltage ripple removing means, while they respond to an input signal of said push-pull power amplifier circuit as applied to said juncture, with the result that said second load means performs an active operation responsive to said input signal.

21. The push-pull power amplifier circuit according to claim 20, wherein said grounding electrode of said first-stage amplifying element is connected to ground potential through impedance means and is connected to said output terminal through feedback impedance means, and said output driver and amplifier portion and said second load means are connected in series between said supply voltage feed terminal and said ground potential through diode coupling means.

22. The push-pull power amplifier circuit according to claim 21, wherein said grounding electrode of said controlling and amplifying element is connected to ground potential through another impedance means.

* * * * *